United States Patent [19]

Philippot et al.

[11] Patent Number: 5,275,697

[45] Date of Patent: Jan. 4, 1994

[54] PROCESS FOR DISSOLUTION OF A CRYSTALLINE MATERIAL

[75] Inventors: Etienne Philippot, St. Mathieu de Treviers; Aline Goiffon, St. Clement de Riviere; Maurice Maurin; Olivier Cambon, both of Montpellier; Alain Ibanez, Clapiers; Jean-Pierre Aubry, Chanteloup les Vignes, all of France

[73] Assignee: Compagnie d'Electronique et de Piezo-Electricite C.E.P.E., Argenteuil, France

[21] Appl. No.: 861,881

[22] PCT Filed: Nov. 8, 1991

[86] PCT No.: PCT/FR91/00876

§ 371 Date: Jun. 22, 1992

§ 102(e) Date: Jun. 22, 1992

[87] PCT Pub. No.: WO92/09110

PCT Pub. Date: May 29, 1992

[30] Foreign Application Priority Data

Nov. 13, 1990 [FR] France ................. 90 14042

[51] Int. Cl.$^5$ .................................. B44C 1/22
[52] U.S. Cl. ...................... 156/667; 156/636; 156/645; 156/654; 252/79.2
[58] Field of Search ........... 156/636, 645, 654, 659.1, 156/663, 667; 29/25.35; 252/79.2, 79.3, 79.4

[56] References Cited

U.S. PATENT DOCUMENTS

| | | | |
|---|---|---|---|
| 4,411,731 | 10/1983 | Miller | 156/663 X |
| 4,626,732 | 12/1986 | Debaisieux et al. | 310/348 |
| 4,686,324 | 8/1987 | Debaisieux et al. | 310/348 X |
| 4,859,898 | 8/1989 | Aubry et al. | 310/353 |
| 4,985,306 | 1/1991 | Morizane et al. | 156/663 X |

FOREIGN PATENT DOCUMENTS 0069112  1/1983  European Pat. Off. .

OTHER PUBLICATIONS

Proceedings of the 39th Annual Frequency Symposium, May 29-31, 1985, Philadelphia(US) pp. 301-308; J. Dowset, et al.: "Etch Processing of Bulk and Surface Wave Devices".

*Primary Examiner*—William A. Powell
*Attorney, Agent, or Firm*—Oblon, Spivak, McClelland, Maier & Neustadt

[57] ABSTRACT

The present invention relates to a process for controlled dissolution of a crystalline material consisting of a number of kinds of ions, in a solution containing a solvent for the crystalline material. Before dissolution, the solution contains at least two kinds of ions of the crystalline material. The molar concentration of ion of each kind is higher than zero and lower than the molar concentration of ion of each kind which the solution would have at saturation if it contained all of the constituent ions of the crystalline material, under the temperature and pressure conditions of the dissolution.

14 Claims, 1 Drawing Sheet

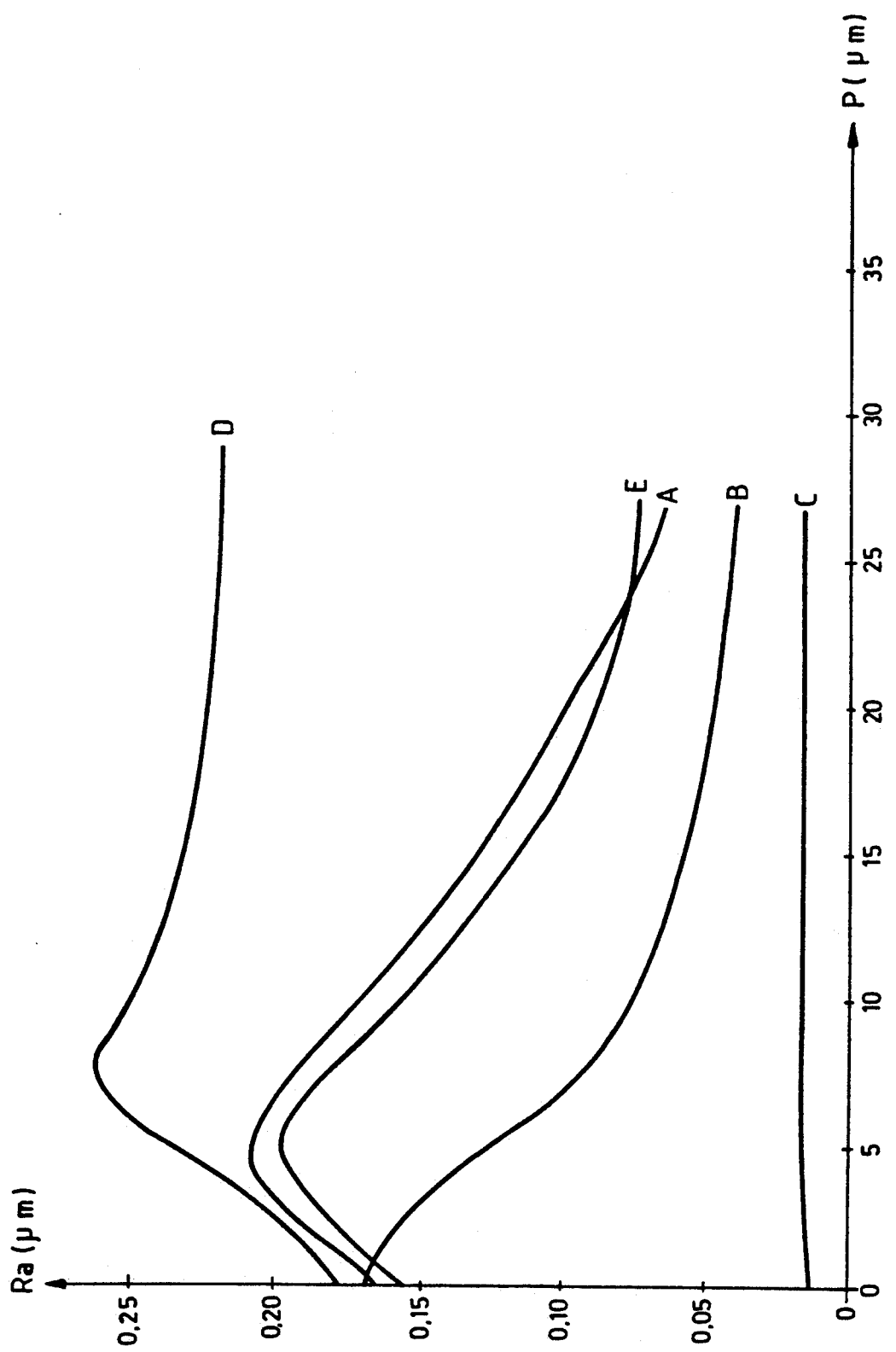

PROCESS FOR DISSOLUTION OF A CRYSTALLINE MATERIAL

The present invention relates to a process for chemical dissolution of a crystalline material. It applies especially to the chemical machining of piezoelectric materials.

The proliferation of radiocommunication devices in which the basic device is a piezoelectric resonator has led to a rapid development of piezoelectric materials. Quartz ($SiO_2$) is the material most commonly employed at present. Many investigations are being made into other materials, especially berlinite ($AlPO_4$) or gallium orthophosphate ($GaPO_4$) because they have properties which differ slightly from those of quartz.

A resonator is made from a lamina of piezoelectric material. At least one electrode is deposited on each main face of the lamina. The resonator is characterised by its resonance frequency. This frequency corresponds to a well-determined thickness of the lamina, between two electrodes. The surface quality of the lamina must be as good as possible, so as not to perturb the frequency response of the resonator. To give the lamina the desired thickness, it is machined at least in its central part. Various machining processes are known. The higher the frequency of the resonator, the thinner is the lamina. At low frequency the machining may be mechanical. The lamina is lapped with an abrasive. For example, in the case of the AT section of quartz a thickness of 40 micrometers corresponds approximately to a frequency of 40 MHz. With higher frequencies it is no longer possible to perform mechanical machining. An ion process can be employed. The lamina is bombarded with accelerated argon ions. The process gives good results from the viewpoint of surface quality, but is costly.

It is also possible to employ a dissolving process which employs, in solution, a solvent for the material to be etched. For example, a berlinite lamina is immersed in a solution of hydrofluoric acid (HF) or of ammonium bifluoride ($NH_4HF_2$). This process is less costly than ion machining but is not always wholly satisfactory from the viewpoint of surface quality.

In fact, crystalline materials do not have a perfect structure. They unavoidably contain structural defects such as dislocations which are flush with the surface of the material. Dissolving using the solvent begins preferentially at the dislocations. Etch pits are then formed at the surface of the material. They become hollow and are transformed into etch channels which run completely across the lamina. The final result is that the surface quality of the lamina does not improve. The pits and channels give rise to severe perturbations of the frequency response of the resonator. This process can be employed only with laminae of high crystalline quality and of high purity.

To overcome these disadvantages, the present invention proposes a process for controlled dissolution of a crystalline material consisting of a number of kinds of ions, making it possible to obtain a correct surface quality even with a crystalline material exhibiting structural defects. This dissolution process is low in cost. This process consists in employing a solution containing, before dissolution, a solvent for the crystalline material and at least two kinds of ions of the crystalline material. The molar concentration of ion of each kind is, on the one hand, higher than zero and, on the other hand, lower than the molar concentration of ion of each kind which the solution would have at saturation if it contained all of the constituent ions of the crystalline material, under the pressure and temperature conditions of the dissolution.

It has been found according to the invention that this process makes it possible to obtain very satisfactory results with berlinite ($AlPO_4$) as crystalline material, the solvent being especially hydrochloric acid, sulphuric acid or phosphoric acid. The dissolution preferably takes place at a temperature between 20° C. and 150° C. and at atmospheric pressure.

The material is not necessarily berlinite; it can be envisaged that the crystalline material may be gallium orthophosphate.

The process can be employed for trimming the edges of a lamina of the crystalline material, for thinning at least a region of the lamina or for excavating at least one opening through the thickness of the lamina.

The process can be employed for partially dissolving a lamina of the crystalline material, the lamina being covered with a mask intended to protect a part of the lamina.

BRIEF DESCRIPTION OF THE DRAWING

The invention will be understood better and other characteristics and advantages will appear on reading the following description, illustrated by the appended single figure which shows the change in the roughness Ra of a sample of berlinite as a function of the depth P of etching, the sample being immersed in various solutions.

When a crystalline material is immersed in a solution capable of dissolving it, a flow of entities is produced from the crystalline material towards the solution. When a crystalline material is immersed in a solution capable of making it grow, a flow of entities is produced from the solution towards the crystalline material. When the two flows cancel each other out, the solution is said to be saturated. Under the pressure and temperature conditions of the experiment it contains a molar concentration Co of constituent ions of the crystalline material, called solubility.

To obtain a controlled growth of a crystalline material a solution which is supersaturated in constituent ions of the crystalline material is employed. The solution contains a molar concentration Cc of constituent ions of the crystalline material which is higher than the molar concentration Co. When the molar concentration Cc is much higher than the molar concentration Co a very rapid and even disorderly growth of the crystalline material is recorded, above all at the unavoidable structural defects. The growth is no longer controlled. Thermodynamic relationships show that good growth of the crystalline material can take place only when the molar concentration Cc is closer to the molar concentration Co.

It has been observed that the phenomena of growth and of dissolution of crystalline materials are reciprocal.

The process of controlled dissolution according to the invention consists in employing a solution containing, before dissolution, a solvent for the crystalline material and at least two kinds of ions of the crystalline material. The solution before dissolution is "undersaturated". Before dissolution the molar concentration of ion of each kind is lower than the molar concentration which the solution would have at saturation if it contained all the ions of the crystalline material (under the pressure and temperature conditions of the dissolution).

The following examples relate to berlinite, in the case of which the invention is particularly advantageous.

The constituent ions of berlinite are the aluminium ions $Al^{3+}$ and phosphate ions $(PO_4)^{3-}$.

Berlinite laminae sawn from a block and then lapped with an abrasive with particles of approximately 3 micrometers were employed. Their initial roughness is of the order of 0.17 micrometers.

Other laminae were polished with an abrasive with particles of approximately 0.3 micrometers. Their initial roughness is of the order of 0.01 micrometer.

In all the tests carried out the average roughness Ra of the sample was measured before dissolution and then many times during the dissolution, with a roughness gauge.

Measurements were made in a number of places of the lamina on both faces.

During the dissolution, the thickness of material removed on both faces of the lamina (or depth P of etching) is controlled by measuring the resonance frequency of the lamina with a frequency meter.

It is possible, for example, to use the following assembly: a three-necked round bottom flask containing the solution is immersed in an oil bath. The temperature of the solution is made uniform by magnetic stirring. One of the necks contains a thermocouple which controls the temperature of the solution. The temperature range is preferably between 20° C. and 150° C.

The second neck contains a condenser which prevents the evaporation of the solution. At least one lamina intended to be machined is introduced into the round bottom flask through the third neck and is immersed in the solution. It is suspended from a platinum wire by means of a teflon clamp or any other solution-resistant means of attachment. The dissolution preferably takes place at atmospheric pressure. These temperature and pressure conditions make the process easier to apply. This allows its cost to be lowered. The thickness of the material to be removed on a resonator lamina is generally small. It can be envisaged that the dissolution will be carried out in an autoclave at low pressure and a temperature above 150° C. when the intention is to increase the rate of etching.

The solvents for berlinite which have been employed are hydrochloric, sulphuric and phosphoric acids. Other solvents can be employed.

A number of alternative forms exist for preparing a solution which dissolves berlinite, in accordance with the process according to the invention.

A first alternative form consists in dissolving aluminium phosphate ($AlPO_4$, commercial berlinite or aluminium phosphate) in one of the abovementioned acids.

In phosphoric acid, another alternative form consists in dissolving aluminium hydroxide $Al(OH)_3$. The hydroxide reacts with the acid to form dissolved aluminium phosphate.

A third alternative form consists in dissolving a mixture of commercial aluminium sulphate and phosphoric acid; a reaction takes place and aluminium phosphate and sulphuric acid are formed.

All these solutions contain all the constituent ions of berlinite (aluminium ions and phosphate ions).

EXAMPLE NO. 1

Before dissolution, the tested solution contains hydrochloric acid (HCl) and aluminium phosphate ($AlPO_4$). The acid concentrations varied between 1 M/l and 12 M/l. The concentrations of phosphate ions and of aluminium ions, before dissolution, are always lower than those which the solution would have at saturation.

The tested laminae are lapped. It is found that the roughness Ra first of all increases with the depth of etching P and then decreases. The maximum roughness is obtained in the case of a depth of etching P of approximately 7 micrometers. This value corresponds to the surface layer of berlinite perturbed by the lapping and the sawing. The beet final roughness obtained is of the order of 0.08 micrometers.

The best results are obtained with concentrations of 2 M/l of $AlPO_4$ and of 6 M/l of HCl. A few pits appear during the dissolution.

EXAMPLE NO. 2

Before dissolution, the tested solution contains sulphuric acid ($H_2SO_4$) and aluminium phosphate ($AlPO_4$). The acid concentrations varied between 1 M/l and 18 M/l. The concentrations of phosphate ions and of aluminium ions, before dissolution, are always lower than those which the solution would have at saturation.

The tested laminae are lapped. The same change in the roughness Ra is observed as in the preceding example. A few pits appear during the dissolution.

The best results are obtained with concentrations of 8 M/l of acid and of 3.6 M/l of aluminium phosphate. Curve (A) shows the change in the roughness Ra as a function of the depth of etching P at the above concentrations.

A roughness curve, in the case of Example No. 1, would have been practically identical with curve (A).

EXAMPLE NO. 3

Before dissolution, the tested solution contains phosphoric acid ($H_3PO_4$) and aluminium phosphate ($AlPO_4$). The concentrations of phosphoric acid varied between 1 M/l and 15 M/l. The concentrations of phosphate ions and aluminium ions, before dissolution, are always lower than those which the solution would have at saturation.

The tests were carried out with lapped laminae and with polished laminae. It is found that the roughness Ra decreases when the depth of etching P increases. A final roughness Ra of the order of 0.05 micrometers can be obtained with a lapped lamina. With a polished lamina the roughness Ra is substantially constant. The number of pits has considerably decreased and even in the best case the pits have disappeared.

The best results were obtained with concentrations of 5.2 M/l of acid and of 2 M/l of aluminium phosphate.

Curves (B) and (C) show, respectively, the change in the roughness Ra with a lapped lamina and a polished lamina at the abovementioned concentrations.

EXAMPLE NO. 4

Before dissolution, the tested solution contains phosphoric acid by itself ($H_3PO_4$). The acid concentrations varied between 1 M/l and 15 M/l. The solution contains only the phosphate ions from the berlinite. The concentration of phosphate ions, before dissolution, is always lower than that which the solution would have at saturation if it contained all the constituent ions of berlinite.

The tests were performed with lapped laminae. It is found that the roughness Ra first of all increases with the depth of etching P and then decreases. The best final roughness obtained is of the order of 0.08 micrometers with an acid concentration of 12 M/l. A few pits appear. Curve (E) shows the change in roughness Ra as a function of the depth of etching P at the above acid concentration. This curve is comparable to curve (A).

Other tests were carried out by way of comparison, on lapped laminae, with a solution containing sulphuric acid by itself. Before dissolution this solution is devoid of any constituent ion of the crystalline material. The concentrations of sulphuric acid are between 1 M/l and 18 M/l. It is found that the roughness Ra of the lamina first of all increases and then decreases slightly. The final roughness is greater than the initial roughness. The surface quality of the lamina has deteriorated. This deterioration is accompanied by a large number of pits which develop into channels running across the lamina in places.

Curve (D) shows the change in the roughness curve with a solution of sulphuric acid.

All these examples show that the solutions which, before dissolution, contain at least two kinds of crystalline material give much better results than if they are devoid thereof.

All the laminae machined by the process in accordance with the invention have shown a sufficient machining quality for an industrial application.

To dissolve gallium orthophosphate chemically it is possible to employ solvents for berlinite under the same temperature and pressure conditions. The constituent ions of gallium orthophosphate are the gallium ions $Ga^{3+}$ and the phosphate ions $(PO_4)^{3-}$.

The process for controlled dissolution according to the invention can be used for producing piezoelectric resonator laminae. The lamina of crystalline material can be thinned in at least one region to reach a desired resonance frequency. These resonators can, in particular, be employed as filters.

The process for controlled dissolution according to the invention can be used to excavate at least one opening through a lamina of the crystalline material. Such a lamina can be used as a sensor. The principal fields are temperature, force, pressure sensors and the like.

The process for controlled dissolution according to the invention can also be employed for trimming the edges of a lamina of crystalline material to the desired gradients.

If the lamina must be partially etched, it can be covered with a mask intended to protect a part of the latter.

The mask may be made of resin, metal or other materials which are not attacked by the solution.

We claim:

1. A process for the chemical machining of an article comprising a crystalline material consisting essentially of a number of different kinds of ions by controlled dissolution of the crystalline material in a solution containing a solvent for the crystalline material and which, before the dissolution, contains at least two kinds of ions of the crystalline material, the molar concentration of ions of each kind being higher than zero and lower than the molar concentration of ions of each kind which the solution would have at saturation if it contained all of the kinds of constituent ions of the crystalline material, under the temperature and pressure conditions of the dissolution, said process comprising immersing the article in the solution and permitting the solution to dissolve a controlled portion of the crystalline material.

2. Process for chemical machining according to claim 1, characterised in that the crystalline material is berlinite ($AlPO_4$), the constituent ions of berlinite being aluminum ions and phosphate ions.

3. Process for chemical machining according to claim 2, characterised in that the solvent is hydrochloric acid, sulphuric acid or phosphoric acid.

4. Process for chemical machining according to claim 2, characterised in that the dissolution takes place at a temperature between 20° C. and 150° C.

5. Process for chemical machining according to claim 2, characterised in that the dissolution takes place at atmospheric pressure.

6. Process which is an etching process according to claim 1, characterised in that the crystalline material is gallium orthophosphate ($GaPO_4$) consisting of gallium ions and of phosphate ions, the solvent being chosen from hydrochloric acid, sulphuric acid and phosphoric acid.

7. Process for chemical machining according to claim 3, characterised in that the dissolution takes place at a temperature between 20° C. and 150° C.

8. Process for chemical machining according to claim 3, characterised in that the dissolution takes place at atmospheric pressure.

9. Process for chemical machining according to claim 4, characterised in that the dissolution takes place at atmospheric pressure.

10. Process for chemical machining according to one of claims 1 to 6, 7, 8 and 9, characterised in that it is employed for trimming the edges of a lamina of the crystalline material.

11. Process for chemical machining dissolution according to one of claims 1 to 6, 7, 8 and 9, characterised in that it is employed for thinning at least a region of a lamina of the crystalline material.

12. Process for chemical machining according to one of claims 1 to 6, 7, 8 and 9, characterised in that it is employed for excavating at least one opening through a lamina of the crystalline material.

13. Process for chemical machining according to one of claims 1 to 6, 7, 8 and 9, characterised in that it is employed for partially dissolving a lamina of the crystalline material, this lamina being covered with a mask intended to protect a part of the lamina.

14. The process of claim 1 wherein the article is a lamina consisting essentially of said crystalline material.

* * * * *